(12) United States Patent
Js Hsiao et al.

(10) Patent No.: US 8,251,223 B2
(45) Date of Patent: Aug. 28, 2012

(54) CLEANING SYSTEM AND A PACKAGE CARRIER FOR A SEMICONDUCTOR PACKAGE

(75) Inventors: Chia-Shun Js Hsiao, Hsin-Chu (TW); Pei-Haw Tsao, Tai-chung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 115 days.

(21) Appl. No.: 12/701,955

(22) Filed: Feb. 8, 2010

(65) Prior Publication Data

US 2011/0192761 A1 Aug. 11, 2011

(51) Int. Cl.
*B65D 85/00* (2006.01)
(52) U.S. Cl. ......... 206/714; 206/713; 206/722; 206/725
(58) Field of Classification Search .................. 206/715, 206/725, 726, 727, 722, 561, 564, 713, 714
See application file for complete search history.

(56) References Cited

U.S. PATENT DOCUMENTS

| | | | | |
|---|---|---|---|---|
| 5,551,572 A * | 9/1996 | Nemoto | | 206/725 |
| 6,109,445 A * | 8/2000 | Beyer | | 206/714 |
| 6,264,037 B1 * | 7/2001 | Maston et al. | | 206/725 |
| 6,371,310 B1 * | 4/2002 | Master et al. | | 211/41.18 |
| 6,474,477 B1 * | 11/2002 | Chang | | 206/725 |
| 6,612,442 B2 * | 9/2003 | Soh et al. | | 206/725 |
| 7,228,622 B2 * | 6/2007 | Watson | | 29/827 |
| 2002/0162770 A1 * | 11/2002 | Chang | | 206/725 |

* cited by examiner

*Primary Examiner* — David Fidei
(74) *Attorney, Agent, or Firm* — Lowe Hauptman Ham & Berner, LLP

(57) ABSTRACT

A semiconductor package holder includes two plates, and each plate defining a through-hole. Each of the plates has a set of first members along a periphery of the through-hole and extending into the through-hole. The first members of one of the plates are positioned to overlie the first members of the other of the plates. One of the at least two plates further has a set of second members along a periphery of the through-hole and extending into the through-hole.

17 Claims, 6 Drawing Sheets

US 8,251,223 B2

CLEANING SYSTEM AND A PACKAGE CARRIER FOR A SEMICONDUCTOR PACKAGE

BACKGROUND

This disclosure relates generally to packaging of integrated circuits, and more particularly to a cleaning system and a package carrier for a semiconductor package.

When packaging a semiconductor chip after circuitry has been formed thereon, the interconnection between the circuitry on the chip and the input/output connecting pins on a package substrate may be implemented by Flip-Chip packaging technology. A Flip-Chip assembly includes a direct electric connection of a face down (that is, "flipped") semiconductor chip onto a package substrate, such as a ceramic substrate, a circuit board, or a carrier using conductive bumps disposed on the semiconductor chip. Flip-Chip technology is quickly replacing older wire bonding technology that uses face up semiconductor chips with the wire connected to each pad on the semiconductor chips.

To package a semiconductor chip using Flip-Chip packaging technology, the semiconductor chip is flipped and positioned on a package substrate. Conductive bumps are reflown to form electric connections therebetween and provide limited mechanical mounting for the semiconductor chip and the package substrate. During the reflowing process, flux is used to facilitate the joining of the conductive bumps, bond pads on the semiconductor chip, and pads on the packaging substrate. Then, excessive flux residues are removed, and an underfilling adhesive, such as epoxy, is used to fill spaces between the semiconductor chip and the package substrate in order to provide even better mechanical interconnection between the semiconductor chip and the package substrate, increase the reliability and fatigue resistance of the package interconnections, and minimize uneven stress distribution caused by thermally induced strains due to the differences in coefficients of thermal expansion (CTE) between the semiconductor chip and package substrate.

However, if the spaces between the semiconductor chip and the package substrate were not filled properly, more stress would be carried by the relatively thin conductive bumps. As such, even a thin film of flux residue can cause premature delamination of a bonded surface, and result in failure in one or more of the interconnections. Therefore, it is important to remove flux residues from the Flip-Chip assembly by a flux cleaning process.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Overview

Figure 1:
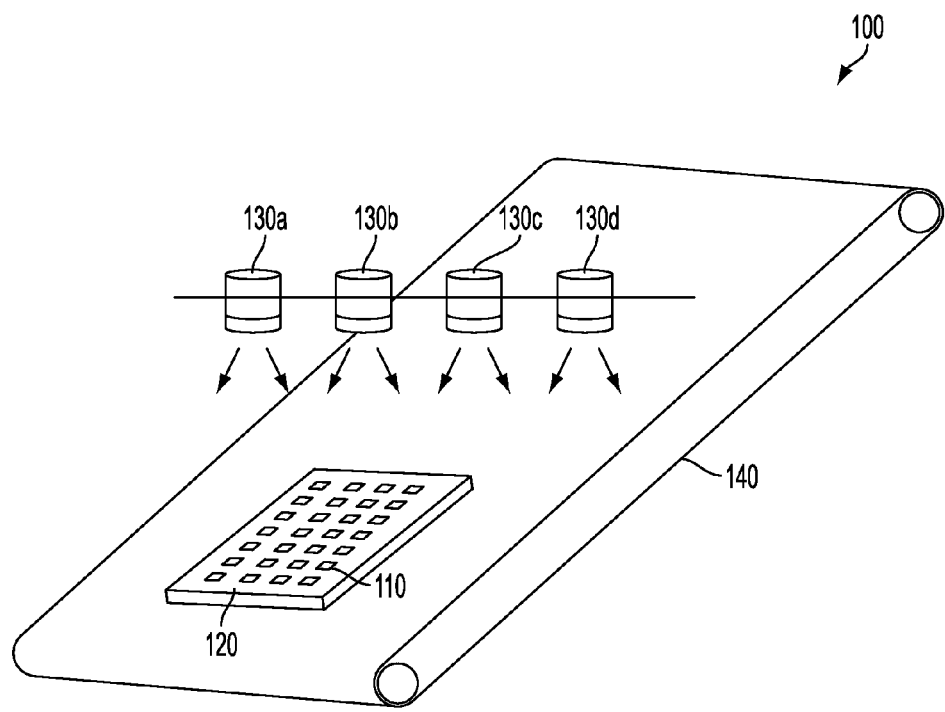
FIG. 1 is a view of a cleaning system for cleaning a semiconductor package.

FIG. 1 depicts a cleaning system 100 for cleaning a semiconductor package 110. The cleaning system 100 includes a package carrier 120, a set of spray nozzles 130a-130d, and a conveyor 140 positioned below the spray nozzles. The package carrier 120 holds the semiconductor package 110. The set of spray nozzles 130a-130d spray cleaning fluid onto the package carrier 120 at a predetermined pressure to wash away excessive flux residue from the semiconductor package. In at least one of the embodiments, the predetermined pressure for spraying the cleaning fluid is set at a range between 800 and 1000 Kilopascals (KPa). Although there are four spray nozzles 130a-130d shown in the FIG. 1, in other embodiments, the number of spray nozzles may be greater or fewer than four, such as one spray nozzle or more than four spray nozzles. Further, the conveyor 140 supports the package carrier 120 and transports the package carrier past the spray nozzles. In some embodiments, the conveyor 140 is replaced by other structures that are capable of providing similar support to the package carrier 120, such as a working table or a working platform. In some other embodiments, the spray nozzles move past the package carrier 120 during a spraying operation.

During operation of the cleaning system to wash away excessive flux residue from the semiconductor package, the cleaning fluid is sprayed onto the package carrier 120 at a predetermined pressure and imposes stress on the semiconductor package. At the same time, the semiconductor package is held by the package carrier 120. As a result, the stress imposed by the pressure of the sprayed cleaning fluid and the force holding the semiconductor package together cause bending and/or vibration stresses of the semiconductor package during the flux cleaning process. In particular, when the semiconductor manufacturing process migrates to 40 nm or smaller technology with extreme-low-K (ELK) dielectric materials (such as materials having dielectric constant less than 3), the bending and/or vibration stresses during the flux cleaning process increases the possibility of damaged/cracked ELK layer and decreases the yield rate of the manufacturing process. Therefore, a carefully designed package carrier 120 helps to ease the above-mentioned effects during the flux cleaning process.

Figure 2:
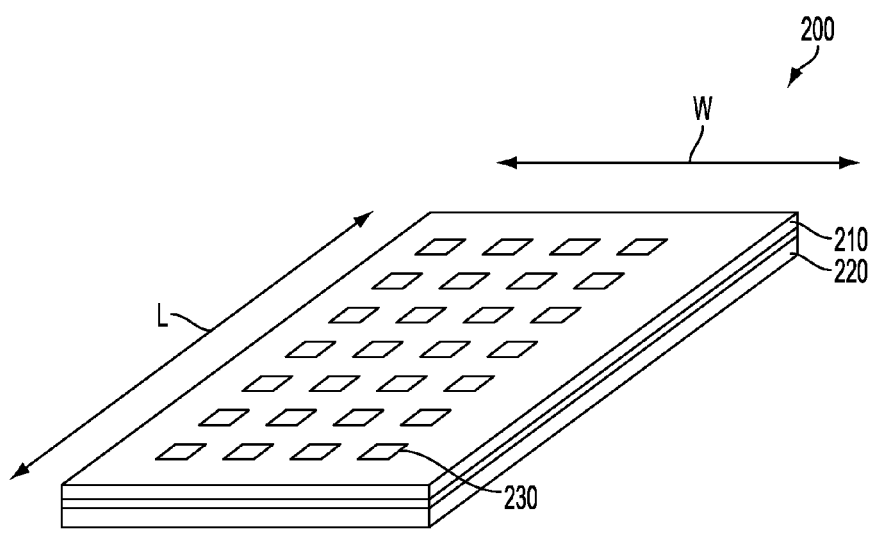
FIG. 2 is a perspective view of a package carrier.

FIG. 2 depicts an exemplary package carrier 200 as used in an embodiment of package carrier 120 (FIG. 1), connection with, for example, the cleaning system 100 (FIG. 1). The package carrier 200 has a top plate 210 and a bottom plate 220, between which semiconductor package(s) are retained. The top plate 210 defines a plurality of top plate openings (through-holes) 230, and the bottom plate 220 defines a plurality of bottom plate openings (not shown) corresponding to the top plate openings 230. For example, as shown in FIG. 2, the top plate 210 and the bottom plate 220 are both rectangular-shaped and are 200 mm in width (indicated by reference W) and 400 mm in length (indicated by reference L). For a particular semiconductor chip package having 23 mm×23 mm (Width×Length) size, the package carrier 200 is capable of holding 32 units of such semiconductor chip package, where the top plate 210 defines 32 top plate openings 230 arranged as a 4×8 array, and the bottom plate 220 defines 32 bottom plate openings arranged as a corresponding 4×8 array. In at least some embodiments, the thickness of the top plate 210 or the bottom plate 220 is set between 1 mm~2 mm.

The shape of the package carrier 200 is not limited to the rectangular shape. For example, in another embodiment, the package carrier 200 is in a shape of a circle; and in yet another embodiment, the package carrier 200 is hexagonal-shaped. The number of semiconductor chip packages that package carrier 200 retains and the arrangement of the top plate openings 230 and corresponding bottom plate openings are not limited to the embodiment described above. For example, in one of the embodiments, the package carrier 200 is configured to hold only one semiconductor package, i.e., the top plate 210 defines only one top plate opening 230, and the bottom plate 220 defines only one bottom plate opening. In another embodiment, the top plate openings 230 and the bottom plate openings are arranged as matrices of hexagonal cells.

In at least some embodiments, the top plate 210 and the bottom plate 220 are made of metal. For example, in a particular embodiment, the top plate 210 and the bottom plate 220 are made of stainless steel. For another example, in one embodiment, the top plate is made of Ni plated Cu, and the bottom plate is made of Ni plated Cu. Further, in another embodiment, the top plate 210 and the bottom plate 220 are made of non-metal materials, such as using plastic for the top plate 210 and plastic for the bottom plate 220. However, in at least some embodiments, the top plate 210 and the bottom plate 220 need not be made of the same material.

Figure 3A:
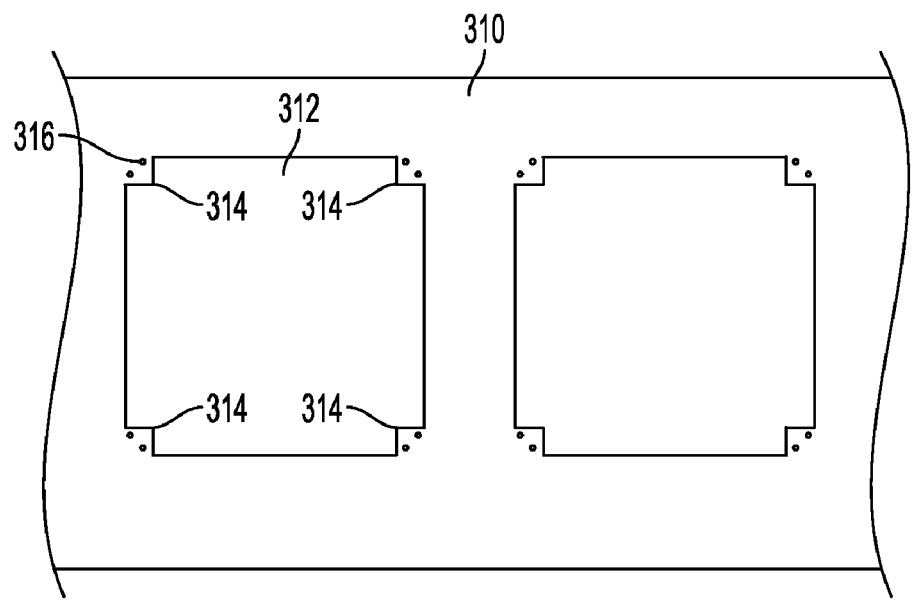
FIG. 3A is a top view of a portion of a top plate of the package carrier according to a configuration of the package carrier of FIG. 2.
Figure 3B:
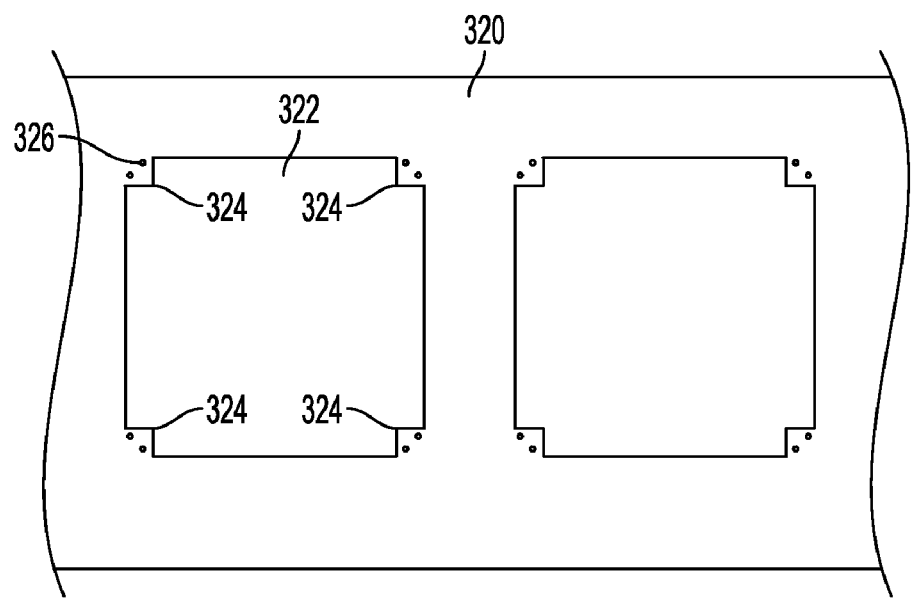
FIG. 3B is a top view of a portion of a bottom plate of the package carrier according to the configuration of FIG. 3A.

FIGS. 3A-3E depict a portion of a package carrier 300 according to a particular configuration of package carrier 200 (FIG. 2). FIGS. 3A and 3B are top views of a portion of a top plate 310 and a bottom plate 320 of the package carrier 300.

Referring to FIG. 3A, the top plate 310 defines a top plate opening 312 therethrough corresponding to the opening 230 depicted in FIG. 2 for retaining the semiconductor package. The top plate 310 has a set of top plate corner protrusions 314 extending inward to the top plate opening 312, and each of the top plate corner protrusions 314 is disposed to align with at least a portion of a corresponding bottom plate corner protrusion 324 (FIG. 3B) defined by the bottom plate. The set of top plate corner protrusions 314 includes four top plate corner protrusions 314. Referring to FIG. 3B, the bottom plate 320 defines at least a bottom plate opening 322 therethrough. The bottom plate 320 has a set of bottom plate corner protrusions 324 extending inward to the bottom plate opening 322, and each of the bottom plate corner protrusions 324 is configured to support at least a portion of a corner of the semiconductor package. The set of bottom plate corner protrusions 324 includes four bottom plate corner protrusions 324, and, in at least some embodiments, each bottom plate corner protrusions 324 supports a different corner of the semiconductor package 350 (FIG. 3C).

Each of the bottom plate corner protrusions 324 has a pair of guide pins 326 extending perpendicularly from the face of the bottom plate, and each of the top plate corner protrusions 314 has a pair of guide pin holes 316 for receiving the guide pins 326 of corresponding bottom plate corner protrusions 324. In at least some embodiments, package carrier 300 comprises greater or fewer numbers of guide pins 326 and guide pin holes 316. In at least one embodiment, there is one guide pin 326 disposed on each bottom plate corner protrusion 324 and one guide pin hole 316 disposed on each top plate corner protrusion 314. Guide pins 326 and their corresponding guide pin holes 316 help to better align top plate opening 312 and bottom plate opening 322 while the top plate 310 and the bottom plate 320 are in an assembled state.

Figure 3C:
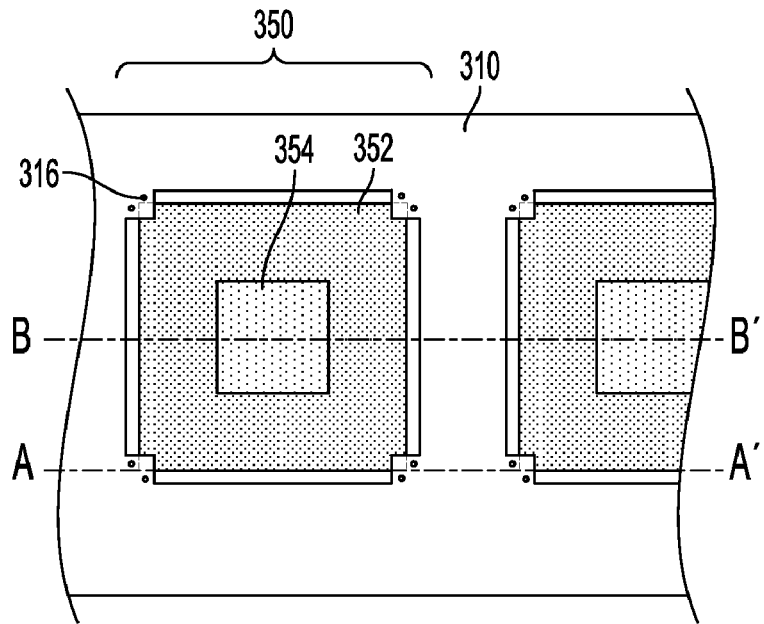
FIG. 3C is a top view of a portion of the package carrier according to the configuration of FIGS. 3A and 3B.

FIG. 3C is a top view of a portion of the package carrier 300 according to the embodiment of FIGS. 3A and 3B, which comprises the top plate 310 and the bottom plate 320 in an assembled state and retaining a semiconductor package 350. The top plate 310 and the bottom plate 320 together hold the semiconductor package 350. The semiconductor package 350 includes a semiconductor chip 354, a package substrate 352, and a set of solder bumps 356 (FIG. 3E) connecting the chip 354 and the package substrate 352. Other than the portions with corner protrusions 314 and 324, the top plate opening 312 and the bottom plate opening 322 are larger in the length and width dimensions than the size of the semiconductor package 350. Thus, during the flux cleaning process, cleaning fluid sprayed onto the semiconductor package 350 is drained by allowing the cleaning fluid to flow through gaps defined by the top plate opening 312, the bottom plate opening 322, and the semiconductor package 350, i.e., between chip 354 and the top and bottom plate openings 312, 322.

Figure 3D:
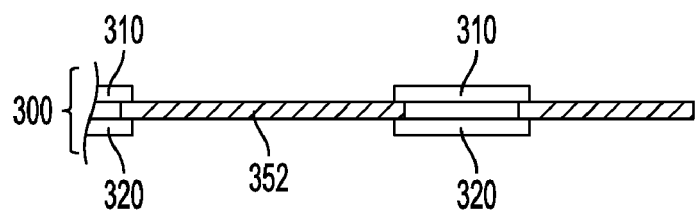
FIGS. 3D-E are cross-sectional views of the package carrier of FIG. 3C taken along lines A-A' and B-B', respectively.
Figure 3E:
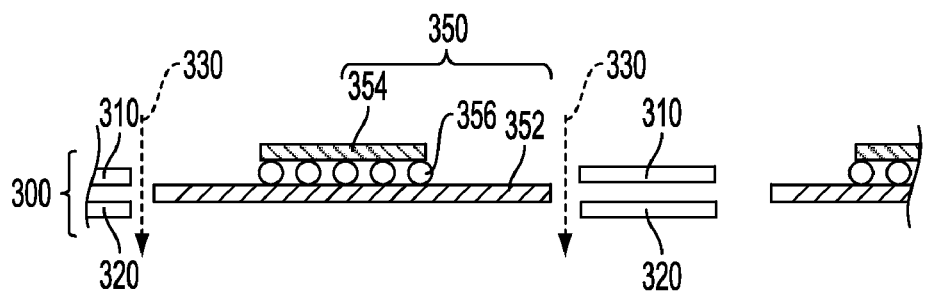

FIG. 3D is a cross-sectional view showing a cross section of the package carrier 300 and the semiconductor package 350 in an assembled state along the A-A' line (FIG. 3C); and FIG. 3E is a cross-sectional view showing the cross section of the package carrier 300 and the semiconductor package 350 in an assembled state along the B-B' line (FIG. 3C). When the package carrier 300 is in an assembled state, each of the bottom plate corner protrusions 324 is aligned with a corresponding top plate corner protrusion 314. The top plate 310 and the bottom plate 320 hold portions of four corners of the semiconductor package 350 by forming a sandwich-like arrangement between the top plate corner protrusions 314, the semiconductor package 350, and the bottom plate corner protrusions 324.

Further, the weight of the top plate 310 provides a force to push the semiconductor package 350 against the bottom plate 320. The top plate opening 312, the bottom plate opening 322, and gaps between the semiconductor package 350, the top plate 310, and the bottom plate 320 together define a path 330 (FIG. 3E) through which the cleaning fluid drains. However, by merely holding portions of four corners of the semiconductor package 350, the semiconductor package 350 may still suffer from certain undesirable level of bending and/or vibration when cleaning fluid is sprayed at the predetermined pressure during the flux cleaning process.

Particular Embodiments

Figure 4A:
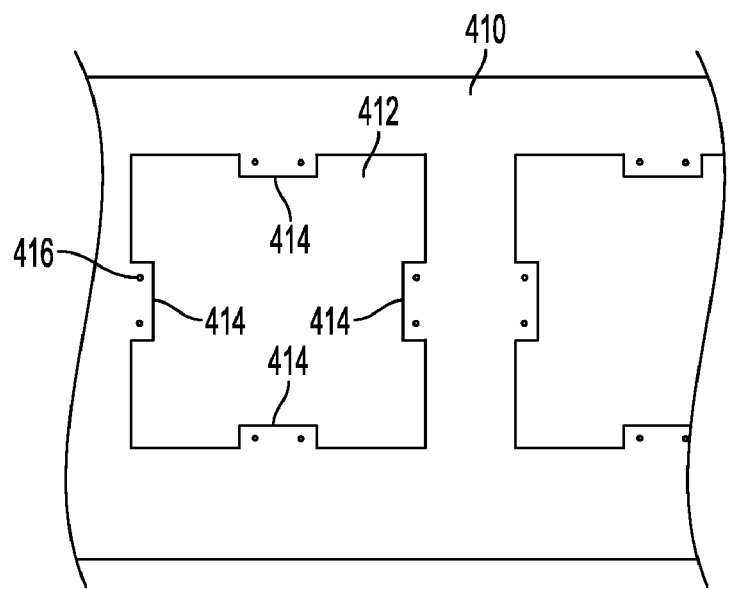
FIG. 4A is a top view of a portion of a top plate of the package carrier according to an embodiment.
Figure 4B:
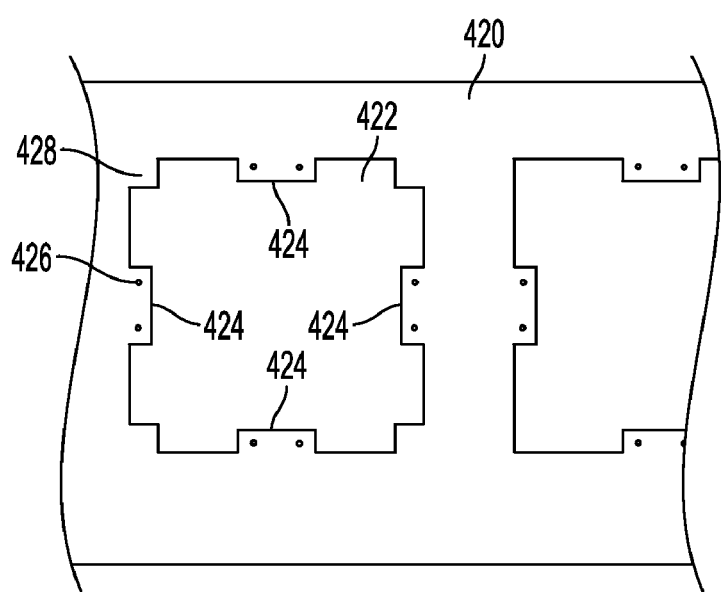
FIG. 4B is a top view of a portion of a bottom plate of the package carrier according to the embodiment of FIG. 4A.

FIGS. 4A-4F depict a portion of a package carrier 400 according to a particular embodiment of package carrier 200 (FIG. 2). FIGS. 4A and 4B are top views of a portion of a top plate 410 (FIG. 4A) and a bottom plate 420 (FIG. 4B) of the package carrier 400.

Referring to FIG. 4A, the top plate 410 defines a top plate opening 412 therethrough corresponding to the opening 230 depicted in FIG. 2. The top plate 420 has a set of top plate side protrusions 414 extending inward to the top plate opening 412, and each of the top plate side protrusions 414 is disposed to align with at least a portion of a corresponding bottom plate side protrusion 424 (FIG. 4B). The top plate opening 412 is rectangular-shaped, and the set of top plate side protrusions 414 includes one top plate side protrusions 414 for each side of the top plate opening 412. In at least some embodiments, the shape of the top plate side opening 412 is not limited to rectangles, and the set of top plate side protrusions 414 includes greater or fewer numbers of top plate side protrusions 414. For example, in one embodiment, the top plate opening 412 is square-shaped, and there are two top plate side protrusions 414 for each side of the top plate side opening 412.

Referring to FIG. 4B, the bottom plate 420 defines at least a bottom plate opening 422 therethrough. The bottom plate 420 has a set of bottom plate side protrusions 424 extending inward to the bottom plate opening 422 along a periphery of the bottom plate 424 opening and a set of bottom plate corner protrusions 428 extending inward to the bottom plate opening 422. Each of the bottom plate side protrusions 424 supports at least a portion of an edge of the semiconductor package 450 (FIG. 4C), and each of the bottom plate corner protrusions 428 supports at least a portion of a corner of the semiconductor package 450. Similar to the description for the top plate 412, the bottom plate opening 422 is rectangular, and the set of bottom plate side protrusions 424 includes one bottom plate side protrusions 424 for each side of the bottom plate opening 422. In at least some embodiments, the shape of the bottom plate opening 422 is not limited to rectangles, and the set of bottom plate side protrusions 424 includes greater or fewer numbers of bottom plate side protrusions 424. For example, in one embodiment, the bottom plate opening 422 is square-shaped, and there are two bottom plate side protrusions 424 for each side of the bottom plate side opening 422.

Figure 4C:
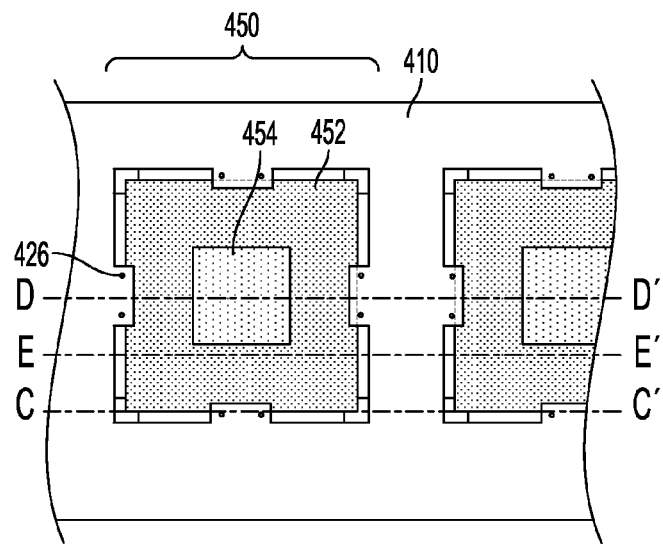
FIG. 4C is a top view of a portion of the package carrier according to the embodiment of FIGS. 4A and 4B.

Each of the bottom plate side protrusions 424 has a pair of guide pins 426 extending perpendicularly from the face of the bottom plate, and each of the top plate side protrusions 414 has a pair of guide pin holes 416 for receiving the guide pins 426 of corresponding bottom plate side protrusions 424. In at least some embodiments, package carrier 400 comprises greater or fewer numbers of guide pins 426 and guide pin holes 416. In at least one embodiment, there is one guide pin 426 disposed on each bottom plate side protrusion 424 and one guide pin hole 416 disposed on each top plate side protrusion 414. Guide pins 426 and their corresponding guide pin holes 416 help to better align top plate opening 412 and bottom plate opening 422 while the top plate 410 and the bottom plate 420 are in an assembled state FIG. 4C is a top view of a portion of the package carrier 400 according to the embodiment depicted in FIGS. 4A and 4B, which comprises the top plate 410 and the bottom plate 420 in an assembled state. The top plate 410 and the bottom plate 420 together retain a semiconductor package 450 therebetween. The semiconductor package 450 includes a chip 454, a package substrate 452, and a set of solder bumps 456 (FIG. 4E) connecting the chip 454 and the package substrate 452. Other than the portions with side protrusions 414 and 424, and the corner protrusions 428, the top plate opening 412 and the bottom plate opening 422 are larger in the length and width dimensions than corresponding dimensions of the semiconductor package 450. Thus, during the flux cleaning process, cleaning fluid sprayed onto the semiconductor package 450 drains through gaps defined by the top plate opening 412, the bottom plate opening 422, and the semiconductor package 450.

Figure 4D:
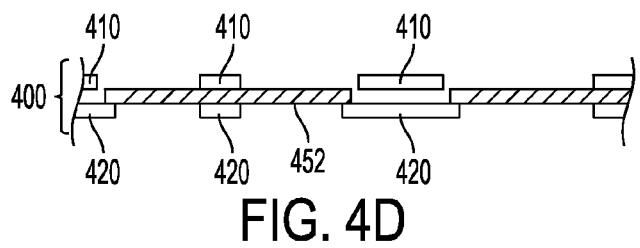
FIGS. 4D-F are cross-sectional views of the package carrier of FIG. 4C taken along lines C-C', D-D', and B-B', respectively.
Figure 4E:
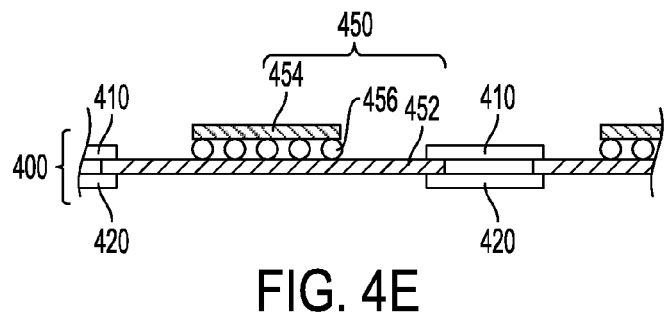
Figure 4F:
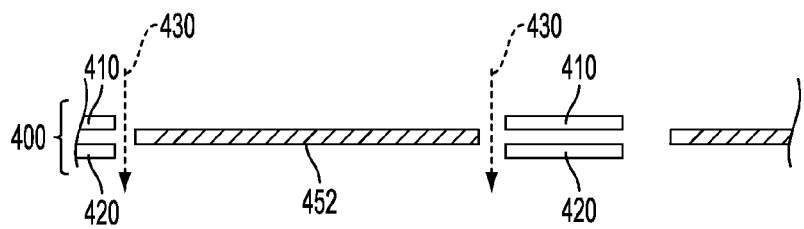

Refer to FIGS. 4D, 4E, and 4F, FIG. 4D is a cross-sectional view showing the cross section of the package carrier 400 and the semiconductor package 450 in an assembled state along the C-C' line (FIG. 4C); FIG. 4E is a cross-sectional view showing the cross section of the package carrier 400 and semiconductor package 450 in an assembled state along the D-D' line (FIG. 4C); and FIG. 4F is a cross-sectional view showing the cross section of the package carrier 400 and the semiconductor package 450 in an assembled state along the E-E' line (FIG. 4C).

When the package carrier 400 is in an assembled state, each of the bottom plate side protrusions 424 align with a corresponding top plate side protrusion 414 and are positional on opposite faces of a respective edge of the semiconductor package 450. The top plate 410 and the bottom plate 420 hold portions of four edges of the semiconductor package 450 by forming a sandwich-like arrangement between the top plate side protrusions 414, the semiconductor package 450, and the bottom plate side protrusions 424.

Further, the weight of the top plate 410 provides a force to push the semiconductor package 450 against the bottom plate 420. The top plate opening 412, the bottom plate opening 422, and gaps between the semiconductor package 450, the top plate 410, and the bottom plate 420 together define a path 430 through which the cleaning fluid drains. Therefore, by holding portions of four edges of the semiconductor package 450, the bending and/or vibration when cleaning fluid is sprayed at the predetermined pressure during the flux cleaning process are minimized because the semiconductor package 450 is more rigidly held at its four edges than at its four corners.

Figure 5A:
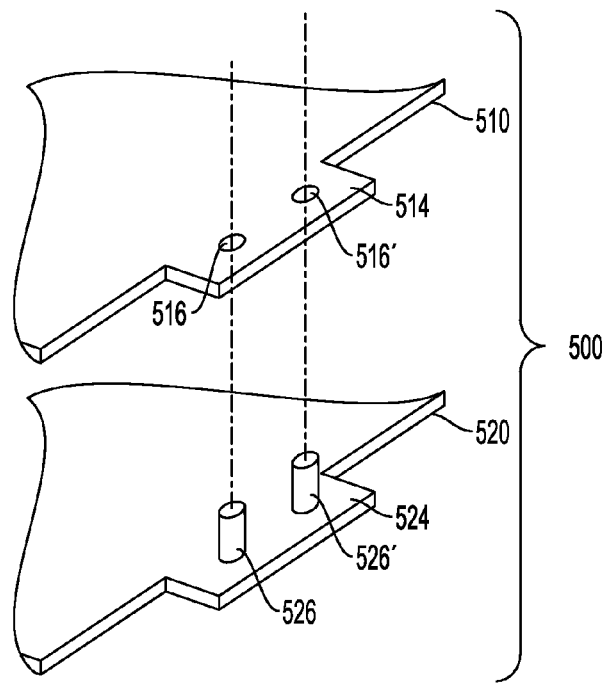
FIG. 5A is a close-up view showing a top plate side protrusion and a bottom plate side protrusion according to an embodiment.
Figure 5B:
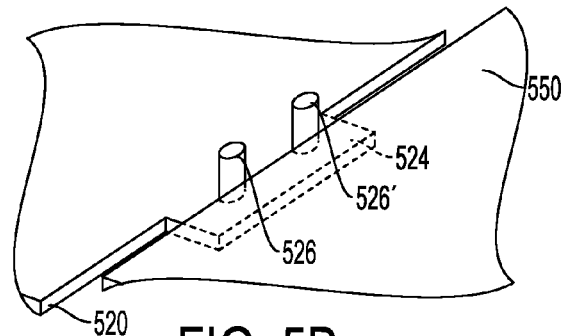
FIG. 5B is a close-up view showing a semiconductor package placed on the bottom plate side protrusion of FIG. 5A.
Figure 5C:
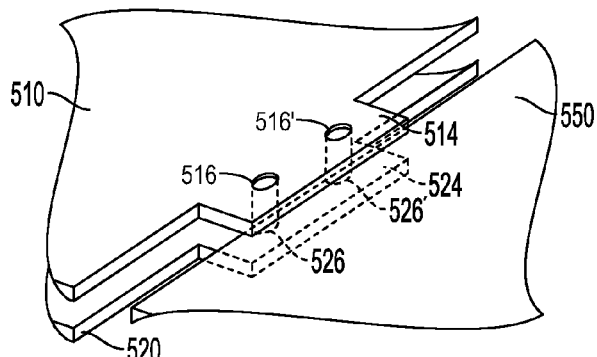
FIG. 5C is a close-up view showing the top plate side protrusion, the semiconductor package, and the bottom plate side protrusion of FIGS. 5A-B in an assembled state.

FIGS. 5A-5C are perspective views of a package carrier 500 according to another particular embodiment of package carrier 400 (FIG. 4) illustrating relationships between a top plate side protrusion 514, a semiconductor package 550, and a bottom plate side protrusion 524, corresponding to the top plate side protrusions, the semiconductor packages, and the bottom plate side protrusions depicted in FIGS. 4A-4F.

FIG. 5A is a close-up view of an interfitting relationship between a top plate side protrusion 514, a pair of guide pin holes 516, 516', a bottom plate side protrusion 524, and a pair of guide pins 526 and 526'. The package carrier 500 includes a top plate 510 and a bottom plate 520. The top plate 510 has at least one top plate side protrusion 514, and the bottom plate 520 has at least one bottom plate side protrusion 524. The top plate side protrusion 514 further has two guide pin holes 516 and 516', and the bottom plate side protrusion 524 further has two guide pins 526 and 526' extending perpendicular to the face of bottom plate 520 and corresponding to the guide pin 516 and 516'.

The guide pins 526 and 526' are cylindrical. In at least some embodiments, at least one of the guide pins 526 or 526' is formed in a shape other than a cylinder. For example, in one embodiment, the guide pin 526 is formed in a shape of an N-sided prism. The guide pins 526 and 526' are formed on the bottom plate side protrusion 524 as an integrated part of the bottom plate 520. In other embodiments, the guide pins 526 and 526' are formed as separate members and fastened to the bottom plate side protrusion 524 by a fastening means such as a screw, an adhesive material, or a threaded portion formed on the guide pins 526 or 526'. In at least one of the embodiments, the bottom plate side protrusion 524 has only one guide pin 526 or 526'. Further, according to FIG. 5A, the sizes and shapes of guide pins 526 and 526' are identical. However, in at least some embodiments, the sizes and shapes of guide pins 526 and 526' are different. For example, in one of the embodiments, the guide pins 526 and 526' are circular cylinders, where the guide pin 526 has a larger diameter than the diameter of the guide pin 526'.

The guide pin holes 516 and 516' are configured to receive the guide pins 526 and 526' of the corresponding bottom plate side protrusion 524. The guide pin holes 516 and 516' are configured in a way that when the package carrier 500 in the assembled state, each of the pin holes 516 and 516' is aligned to receive the corresponding pins 526 or 526'. The sizes and shapes of the cross sections of guide pin holes 516 and 516' are the same as their corresponding guide pins 526 and 526'.

FIG. 5B is a close-up view illustrates a semiconductor package 550 placed on the bottom plate side protrusion 524 of FIG. 5A. When the semiconductor package 550 is placed on the bottom plate 520, a portion of the edge of the semiconductor package 550 is placed on and supported by the bottom plate side protrusion 524. In at least one embodiment, the edge of the semiconductor package 550 abuts the guide pins 526 and 526'.

FIG. 5C is a close-up view showing the top plate side protrusion, the semiconductor package, and the bottom plate side protrusion of FIGS. 5A-B in an assembled state. The top side protrusion 514 is aligned with the corresponding bottom plate side protrusion 524. The weight of the top plate 510 provides a force to push the semiconductor package 550 against the bottom plate 520. In at least some embodiments, the top plate 510 and the bottom plate 520 are made of metal. For example, in a particular embodiment, the top plate 510 and the bottom plate 520 are made of stainless steel. However, the top plate 510 and the bottom plate 520 are not limited to comprising the same material.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A package carrier for holding a semiconductor package, the package carrier comprising:
   a first plate defining a first opening therethrough, the first plate comprising a set of first plate side protrusions extending inward to the first opening along a periphery of the first opening, and each of the first plate side protrusions being configured to support at least a portion of an edge of the semiconductor package; and
   a second plate defining a second opening therethrough, the second plate comprising a set of second plate side protrusions extending inward to the second opening, and each of the second plate side protrusions being disposed along a periphery of the second opening to align with at least a portion of a corresponding first plate side protrusion,
   the package carrier being in an assembled state, each of the first plate side protrusions being aligned with a corresponding second plate side protrusion and sandwiching therebetween a respective edge of the semiconductor package,
   wherein at least one of the first plate side protrusion comprises a pin, and at least one of the second plate side protrusions comprises a pin hole for receiving the pin of a corresponding first plate side protrusion.

2. The package carrier of claim 1, wherein the package carrier in the assembled state, the pin hole is aligned to receive the pin.

3. A package carrier for holding a semiconductor package, the package carrier comprising:
   a first plate defining a first opening therethrough, the first plate comprising a set of first plate side protrusions extending inward to the first opening along a periphery of the first opening, and each of the first plate side protrusions being configured to support at least a portion of an edge of the semiconductor package; and
   a second plate defining a second opening therethrough, the second plate comprising a set of second plate side protrusions extending inward to the second opening, and each of the second plate side protrusions being disposed along a periphery of the second opening to align with at least a portion of a corresponding first plate side protrusion,
   the package carrier being in an assembled state, each of the first plate side protrusions being aligned with a corresponding second plate side protrusion and sandwiching therebetween a respective edge of the semiconductor package,
   wherein at least one of the first plate side protrusions comprises two pins, and a corresponding at least one of the second plate side protrusions comprises two pin holes for receiving the pins of the at least one of the first plate side protrusions.

4. The package carrier of claim 1, wherein the second plate is made of metal.

5. The package carrier of claim 1, wherein at least one of the first plate or the second plate is made of stainless steel.

6. The package carrier of claim 1, wherein the first plate further comprises a set of first plate corner protrusions extending inward to the first opening, and each of the first plate corner protrusions is configured to support at least a portion of a corner of the semiconductor package.

7. The package carrier of claim 1, wherein the first plate defines 32 said first plate openings arranged as a 4×8 array, and the second plate defines 32 said second plate openings arranged as a 4=8 array.

8. The package carrier of claim 1, wherein a thickness of the first plate is between 1 mm and 2 mm, and a thickness of the second plate is between 1 mm and 2 mm.

9. A semiconductor package holder, comprising:
   two plates, each plate defining a through-hole therethrough, each plate comprising a set of first members along a periphery of the through-hole and extending into the through-hole, the first members of a first plate of the plates being positioned to overlie the first members of a second plate of the plates;
   a set of second members only along a periphery of the through-hole of the first plate and extending into the through-hole;
   on at least one of the first members of the first plate, at least one guide pin extending from the at least one of the first members; and
   on at least one of the first members of the second plate, at least one pin hole in alignment with the at least one guide pin.

10. The semiconductor package holder of claim 9, wherein the second plate is made of metal.

11. The semiconductor package holder of claim 9, wherein at least one of the first plate or the second plate is made of stainless steel.

12. The semiconductor package holder of claim 9, wherein a thickness of the first plate is between 1 mm and 2 mm, and a thickness of the second plate is between 1 mm and 2 mm.

13. The package carrier of claim 3, wherein the second plate is made of metal.

14. The package carrier of claim 3, wherein at least one of the first plate or the second plate is made of stainless steel.

15. The package carrier of claim 3, wherein the first plate further comprises a set of first plate corner protrusions extending inward to the first opening, and each of the first plate corner protrusions is configured to support at least a portion of a corner of the semiconductor package.

16. The package carrier of claim 3, wherein the first plate defines 32 said first plate openings arranged as a 4×8 array, and the second plate defines 32 said second plate openings arranged as a 4×8 array.

17. The package carrier of claim 3, wherein a thickness of the first plate is between 1 mm and 2 mm, and a thickness of the second plate is between 1 mm and 2 mm.

* * * * *